United States Patent [19]
Tsunemine

[11] Patent Number: 5,981,331
[45] Date of Patent: Nov. 9, 1999

[54] METHOD OF MANUFACTURING A SEMICONDUCTOR MEMORY DEVICE WITH A HIGH DIELECTRIC CONSTANT CAPACITOR

[75] Inventor: Yoshikazu Tsunemine, Hyogo, Japan

[73] Assignee: Mitsubishi Denki Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/901,245

[22] Filed: Jul. 25, 1997

Related U.S. Application Data

[62] Division of application No. 08/690,779, Aug. 1, 1996, Pat. No. 5,699,291.

[30] Foreign Application Priority Data

Mar. 29, 1996 [JP] Japan .................................. 8-076071

[51] Int. Cl.$^6$ ............................................... H01L 21/8242
[52] U.S. Cl. ................................................. 438/240; 438/3
[58] Field of Search ...................................... 438/238, 253, 438/240, 397, 398, 3; 257/310

[56] References Cited

U.S. PATENT DOCUMENTS

| | | | |
|---|---|---|---|
| 5,448,512 | 9/1995 | Hachisuka et al. | 257/310 |
| 5,506,166 | 4/1996 | Sandhu et al. | 437/60 |
| 5,567,964 | 10/1996 | Kashihara et al. | 257/310 |
| 5,699,291 | 12/1997 | Tsunemine | 365/149 |

FOREIGN PATENT DOCUMENTS 6-295880  10/1994  Japan .

*Primary Examiner*—Joni Chang
*Attorney, Agent, or Firm*—McDermott, Will & Emery

[57] ABSTRACT

In a semiconductor memory device and a manufacturing method thereof, a barrier metal layer having a step $h_2$ which is smaller than the step $h_1$ at the upper end of a contact hole is formed on the surface opposite to the contact hole. The barrier metal layer has a nitrogen concentration gradient which becomes higher from its lower layer to its upper layer. A semiconductor memory device provided with a highly planer capacitor lower electrode, and a method of manufacturing the semiconductor memory device can thus be provided.

6 Claims, 11 Drawing Sheets

METHOD OF MANUFACTURING A SEMICONDUCTOR MEMORY DEVICE WITH A HIGH DIELECTRIC CONSTANT CAPACITOR

This application is a division of application Ser. No. 08/690,779 filed Aug. 1, 1996, U.S. Pat. No. 5,699,201.

BACKGROUND OF THE INVENTION

1. Field of the Invention

The present invention relates to a semiconductor memory device and a manufacturing method thereof, and more particularly, to a semiconductor memory device and a manufacturing method thereof in which material of high dielectric constant is used for a capacitor dielectric film of a DRAM (Dynamic Random Access Memory).

2. Description of the Background Art

DRAM has been known as a semiconductor memory device which allows random input and output of memory information. The DRAM generally has a memory cell array portion which is a memory area with a large amount of memory information stored therein, and a peripheral circuit portion which is necessary for the external input and Output.

A plurality of memory cells each for storing unit memory information are arranged on a matrix in the memory cell array portion which occupies a large area on a semiconductor chip. One memory cell generally consists of one MOS (Metal Oxide Semiconductor) transistor and one capacitor connected to the MOS transistor. Such a memory cell is referred to as a one-transistor/one-capacitor type memory cell.

The integration of a memory cell array can be improved easily in this one-transistor/one-capacitor type memory cell because of its simple structure. Such a memory cell is therefore widely utilized in a DRAM of large capacity.

Memory cells of conventional DRAMs can be classified into several types according to their capacitor structures. One of them is referred to as a stacked type capacitor. The stacked type capacitor is structured such that the main portion in the capacitor structure is extended over a gate electrode of MOS transistor and a field oxide film, thereby increasing the opposing areas between capacitor electrodes.

Owing to such a characteristic of the stacked type capacitor, certain capacitance of a capacitor could be secured even if circuit elements are miniaturized as a semiconductor memory device is highly integrated. The stacked type capacitor is thus widely utilized as the integration of a semiconductor memory device is promoted.

However, when the elements are further miniaturized, securing the certain capacitance of a capacitor is difficult in, for example, a DRAM of 256 Mbit, even if the stacked type capacitor is used.

In an attempt of increasing the capacitance of a capacitor, a capacitor dielectric film formed of material having high dielectric constant (e.g. Barium Strontium Titanate (BST)) is used.

With reference to FIG. 19, a description will be given as to a cross sectional structure of a memory cell of a DRAM in which material having high dielectric constant is used for a capacitor dielectric film.

A source region 6 and drain regions 7a, 7b formed of impurity diffusion regions are provided at a major surface of a semiconductor substrate 1. On the major surface of semiconductor substrate 1, a gate electrode 4a is formed with a gate oxide film 5a therebetween, and a gate electrode 4b is further formed with a gate oxide film 5b therebetween. A field oxide film 2 is provided at a prescribed region of the major surface of semiconductor substrate 1 for defining an active region.

In source region 6, a buried bit line 9 is provided for gate electrodes 4a and 4b with gate protection oxide films 8a and 8b interposed, and is covered with an oxide film 10.

An MOS transistor 3a is constituted by gate electrode 4a, source region 6 and drain region 7a, and an MOS transistor 3b is constituted by gate electrode 4b, source region 6 and drain region 7b.

A polysilicon plug 12 is provided within a contact hole 11a formed in an interlayer insulating film 11, and electrically connected to drain region 7b.

Barrier metal layers 13a, 13b are formed on polysilicon plug 12 to cover interlayer insulating film 11, and capacitor lower electrodes 14a, 14b are formed on barrier metal layers 13a, 13b.

A dielectric film 15 of material having high dielectric constant is further provided on capacitor lower electrodes 14a and 14b to cover barrier metal layers 13a, 13b and the surface of interlayer insulating film 11. An upper electrode 16 is further provided to cover high dielectric constant material 15. It is noted that platinum is used for lower electrode 14b and upper electrode 16.

On upper electrode 16, first aluminum interconnections 18a, 18b, 18c are formed with an interlayer insulating film 17 therebetween, and a first aluminum interlayer insulating film 19 is provided to cover first aluminum interconnections 18a, 18b, 18c. A second aluminum interconnection 20 is provided on first aluminum interlayer insulating film 19.

An operation of a memory cell in a DRAM structured as above will be next described.

The stacked type capacitor shown in FIG. 19 is utilized as a cell capacitor or the like in a semiconductor integrated circuit. In this case, information is stored by accumulating charges of signals controlled by MOS transistor 3b, for example, in capacitor lower electrode 14b formed on the same substrate as MOS transistor 3b.

The amount Q of accumulated charges can be expressed as follows using a relative dielectric constant $\in$ between a capacitor region S and dielectric film 15 and a film thickness t of dielectric film 15.

$$Q = \in_o \cdot \in \cdot S \cdot V / t$$

where $\in_o$ denotes a dielectric constant under vacuum and V denotes voltage applied to a capacitor.

The amount Q of charges should be sufficiently large but should not cause a memory error called a soft error due to excess charges generated by ionizing radiation.

In a semiconductor circuit of lower integration, a silicon oxide film formed by thermally oxidizing silicon, or a silicon nitride film formed by CVD method has been conventionally used as a dielectric film. However, as circuit elements are highly integrated and capacitor region S is decreased, to obtain charge accumulation large enough but will not cause a soft error becomes impossible with above described silicon oxide film or silicon nitride film.

As shown in FIG. 19, the high dielectric constant material having high relative dielectric constant, such as barium strontium titanate, tantalum oxide, lead titanate, or strontium titanate is utilized as a dielectric film.

For example, the high relative dielectric constant of lead titanate is 1000 or more, and that of strontium titanate is approximately 200. An enhanced insulating property could be obtained when a film of above material is formed avoiding oxide defects. Other than the lead titanate, barium titanate is known as material for a dielectric film.

A thin film of, e.g., strontium titanate is usually formed using the reactive sputtering or CVD method. In this case, a film is often formed in an oxidation ambient at a high temperature of approximately 500–700° C. in order to prevent an increase of leak current due to the oxide defect.

As described above, platinum having high resistance to oxidation is utilized as material for lower electrode in a thin film capacitor in which the lead titanate is used. Barrier metal layers 13a, 13b are further necessary between lower electrode 14b and polysilicon plug 12 as barrier metal (diffusion preventing films) having the conductivity which prevents diffusion of silicon and oxygen, in order to prevent oxidation of that portion of a silicon substrate which is electrically connected to the lower electrode.

However, in the capacitor structure in the conventional DRAM shown in FIG. 19, there is a step portion of height $h_1$ on the top of contact hole 11a.

The step portion is generated in the steps of forming a polysilicon film according to CVD and etching back the polysilicon film in order to form a polysilicon plug 12 within contact hole 11a.

Although the height of the step portion could be reduced by adjusting etching conditions, it is impossible to eliminate the step portion because the polysilicon film has a higher etching rate than interlayer insulating film 11.

Accordingly, there are step portions also on the surfaces of barrier metal layer 13b, lower electrode 14b and dielectric film 15 according to the step portion in contact hole 11a.

An almost right-angled portion is accordingly formed in lower electrode 14b in the step portion as enclosed by X in FIG. 19. Electric field is concentrated in the right-angled portion upon an application of voltage, producing a high electric current. As a result, a degradation of dielectric film 15 contacting with the upper surface of the right-angled portion is accelerated, resulting in a shorter lifetime and a lower reliability of the capacitor.

SUMMARY OF THE INVENTION

One object of the present invention is to provide a structure having a planer capacitor lower electrode, a semiconductor memory device in which such a structure can be easily realized and a method of manufacturing the same.

Another object of the present invention is to provide a highly reliable semiconductor memory device in which degradation of a dielectric film and an electrode is prevented, and to provide a method of manufacturing such a semiconductor memory device.

A semiconductor memory device according to one aspect of the present invention includes: a semiconductor substrate having a major surface; an impurity region formed at the major surface of the semiconductor substrate; an interlayer insulating film formed on the major surface of the semiconductor substrate and having a contact hall connected to the impurity region; a plug electrode electrically connected to the impurity region and formed in the contact hall down to a point hi below the upper end of the contact hole; a barrier metal layer covering the surfaces of the plug electrode and the interlayer insulating film and having a step portion of smaller dimension $h_2$ than $h_1$ on the surface opposite to the contact hole; a capacitor lower electrode formed only on the surface of the barrier metal layer; a capacitor dielectric film of material having high dielectric constant formed to cover the capacitor lower electrode and the barrier metal layer; and a capacitor upper electrode formed to cover the capacitor dielectric film.

In the structure described above, the dimension of the step portion $h_2$ formed on the surface of the barrier metal layer is smaller than that of the step portion $h_1$ formed on the upper end of the contact hole. Therefore, such a step portion in the lower electrode as found in the conventional structure does not result. Electric field is not concentrated in the lower electrode even if voltage is applied to it. As a result, degradation of a dielectric film opposite to the lower electrode can be prevented, and longer life time of the dielectric film can be achieved. An improved reliability of a capacitor can thus be acquired.

A semiconductor memory device according to another aspect of the invention includes: a semiconductor substrate having a major surface; an impurity region formed at the major surface of the semiconductor substrate; an interlayer insulating film formed on the major surface of the semiconductor substrate and having a contact hole connected to the impurity region; a plug electrode electrically connected to the impurity region and formed in the contact hole; a barrier metal layer of metal nitride having such a nitrogen concentration gradient that becomes higher from its lower layer to its upper layer, covering the surfaces of the plug electrode and the interlayer insulating film; a capacitor lower electrode formed only on the surface of the barrier metal layer; a capacitor dielectric film of material having high dielectric constant formed to cover the capacitor lower electrode and the barrier metal layer; and a capacitor upper electrode formed to cover the capacitor dielectric film.

Contact resistance to the plug electrode at the interface between the barrier metal layer and the plug electrode can be reduced since the barrier metal layer is formed of metal nitride having such a nitrogen concentration gradient that becomes higher from its lower layer to its upper layer, resulting in lower concentration of nitrogen in the lower layer of the barrier metal layer as is described above. In the upper layer portion of the barrier metal layer, the concentration of nitride is high enough to maintain its barrier function for the lower electrode at the interface between the barrier metal layer and the capacitor lower electrode. Improved capacitor reliability can thus be possible.

A semiconductor memory device according to still another aspect of the invention includes: a semiconductor substrate having a major surface; an impurity region formed at the major surface of the semiconductor substrate; an interlayer insulating film formed on the major surface of the semiconductor substrate and having a contact hole connected to the impurity region; a plug electrode electrically connected to the impurity region and formed in the contact hole down to a point $h_1$ below the upper end of the contact hole; a barrier metal layer formed in the contact hole on the surface of the plug electrode; a capacitor lower electrode covering the surfaces of the barrier metal layer and the interlayer insulating film and having a step portion of smaller dimension $h_2$ than $h_1$ on the surface opposite to the contact hole; a capacitor dielectric film of material having high dielectric constant formed to cover the capacitor lower electrode and the interlayer insulating film; and a capacitor upper electrode formed to cover the capacitor dielectric film.

The step portion found in the conventional structure is not formed in the lower electrode since the barrier metal layer is buried within the contact hole and the step $h_2$ formed on the surface of the capacitor lower electrode is smaller than the step $h_1$ formed on the upper end of the contact hole in above described structure.

As a result, degradation of the dielectric film formed on the lower electrode can be prevented, enabling longer life time of the dielectric film, since electric field is not concentrated in the lower electrode even if voltage is applied to the lower electrode. Reliability of the capacitor can thus be improved.

A semiconductor memory device according to a further aspect of the present invention includes: a semiconductor substrate having a major surface; an impurity region formed at the major surface of the semiconductor substrate; an interlayer insulating film formed on the major surface of the semiconductor substrate and having a contact hole connected to the impurity region; a plug electrode electrically connected to the impurity region and formed in the contact hole; a barrier metal layer of metal nitride having such a nitrogen concentration gradient which becomes higher from its lower layer to its upper layer, formed within the contact hole on the surface of the plug electrode; a capacitor lower electrode formed on the surfaces of the barrier metal layer and the interlayer insulating film; a capacitor dielectric film of material having high dielectric constant formed to cover the capacitor lower electrode and the interlayer insulating film; and a capacitor upper electrode formed to cover the capacitor dielectric film.

Contact resistance to the plug electrode can be reduced at the interface between the barrier metal layer and the plug electrode, since the barrier metal layer is formed of metal nitride having such a nitrogen concentration gradient which becomes higher from its lower layer to its upper layer and the lower layer of the barrier metal layer thus has lower concentration of nitrogen. The barrier metal layer has enough barrier property at the interface between itself and the lower electrode since the upper layer of the barrier metal layer is sufficiently nitrogenized. As a result, the reliability of the capacitor can be improved.

A method of manufacturing a semiconductor memory device according to one aspect of the present invention includes steps of: forming an impurity region at a major surface of a semiconductor substrate; forming an interlayer insulating film provided with a contact hole connected to the impurity region on the major surface of the semiconductor substrate; forming a plug electrode electrically connected to the impurity region, in the contact hole down to the point a prescribed distance below the upper end of the contact hole; forming a metal layer on the surfaces of the plug electrode and the interlayer insulating film; forming a barrier metal layer by annealing the metal layer in a gas ambient including nitrogen atoms; forming a capacitor lower electrode layer on the surface of the barrier metal layer; patterning the barrier metal layer and the capacitor lower electrode layer to a prescribed shape; forming a capacitor dielectric film of material having high dielectric constant to cover the capacitor lower electrode layer and the barrier metal layer; and forming a capacitor upper electrode to cover the capacitor dielectric film.

Using above described method, the metal layer formed within the contact hole on the plug electrode expands in volume, since the metal layer is annealed in the gas ambient including nitrogen atoms in the step of forming the barrier metal layer. The step portion located in the upper portion of the contact hole can be reduced by having the metal layer expanded in volume at the upper portion of the contact hole.

As a result, there is no step portion found in the conventional structure on the surface of the capacitor lower electrode formed on the barrier metal layer.

Degradation of the dielectric film on the lower electrode can be prevented enabling longer life time of the dielectric film since electric field is not concentrated in the lower electrode even if voltage is applied to the lower electrode. Reliability of the capacitor can thus be improved.

Contact resistance to the plug electrode at the interface between the barrier metal layer and the plug electrode can be reduced since the barrier metal layer is formed of metal nitride having such a nitrogen concentration gradient which becomes higher from its lower layer to its upper layer, resulting in lower concentration of nitrogen in the lower layer of the barrier metal layer. On the other hand, the upper layer of the barrier metal layer is nitrogenized enough to have sufficient barrier property at the interface between the barrier metal layer and the lower electrode. As a result, an improved capacitor reliability can be obtained.

A method of manufacturing a semiconductor memory device according to another aspect of the invention includes steps of: forming an impurity region at a major surface of a semiconductor substrate; forming an interlayer insulating film provided with a contact hole connected to the impurity region on the surface of the semiconductor substrate; forming a plug electrode electrically connected to the impurity region and including silicon within the contact hole down to a point a prescribed distance below the upper end of the contact hole; forming a metal layer on the surfaces of the plug electrode and the interlayer insulating film; forming a metal silicide layer between the plug electrode and the metal layer by a first annealing; forming a barrier metal layer by a second annealing of the metal silicide layer in a gas ambient including nitrogen atoms; leaving the barrier metal layer in the contact hole; forming a capacitor lower electrode on the surfaces of the barrier metal layer and the interlayer insulating film; forming a capacitor dielectric film of material having high dielectric constant to cover the capacitor lower electrode and the interlayer insulating film; and forming a capacitor upper electrode to cover the capacitor dielectric film.

As explained above, the metal silicide layer is formed between the plug electrode and the metal layer by the first annealing, and the second annealing of this metal silicide layer in the gas ambient including nitrogen atoms produces the barrier metal layer. The metal silicide layer accordingly expands in volume through the second annealing of the metal silicide layer in the gas ambient including nitrogen atoms.

The step portion produced in the upper portion of the contact hole can thus be reduced, resulting in no step portion such as the one found in the conventional structure, in the capacitor lower electrode formed on the barrier metal layer. Longer life time of the dielectric film formed on the lower electrode can be obtained, since electric field is not concentrated in the lower electrode even if voltage is applied to the lower electrode. The capacitor reliability can be improved accordingly.

Contact resistance to the plug electrode at the interface between the barrier metal layer and the plug electrode can be reduced by providing the barrier metal layer formed of metal nitride having such a nitrogen concentration gradient which becomes higher from its lower layer to its upper layer and the lower layer of the barrier metal layer thus has lower concentration of nitrogen. On the other hand, the upper layer of the barrier metal layer is nitrogenized enough to maintain sufficient barrier property at the interface between the barrier metal layer and the lower electrode. As a result, the capacitor reliability can be improved.

The foregoing and other objects, features, aspects and advantages of the present invention will become more apparent from the following detailed description of the

DESCRIPTION OF THE PREFERRED EMBODIMENTS

[First Embodiment]

Figure 1:
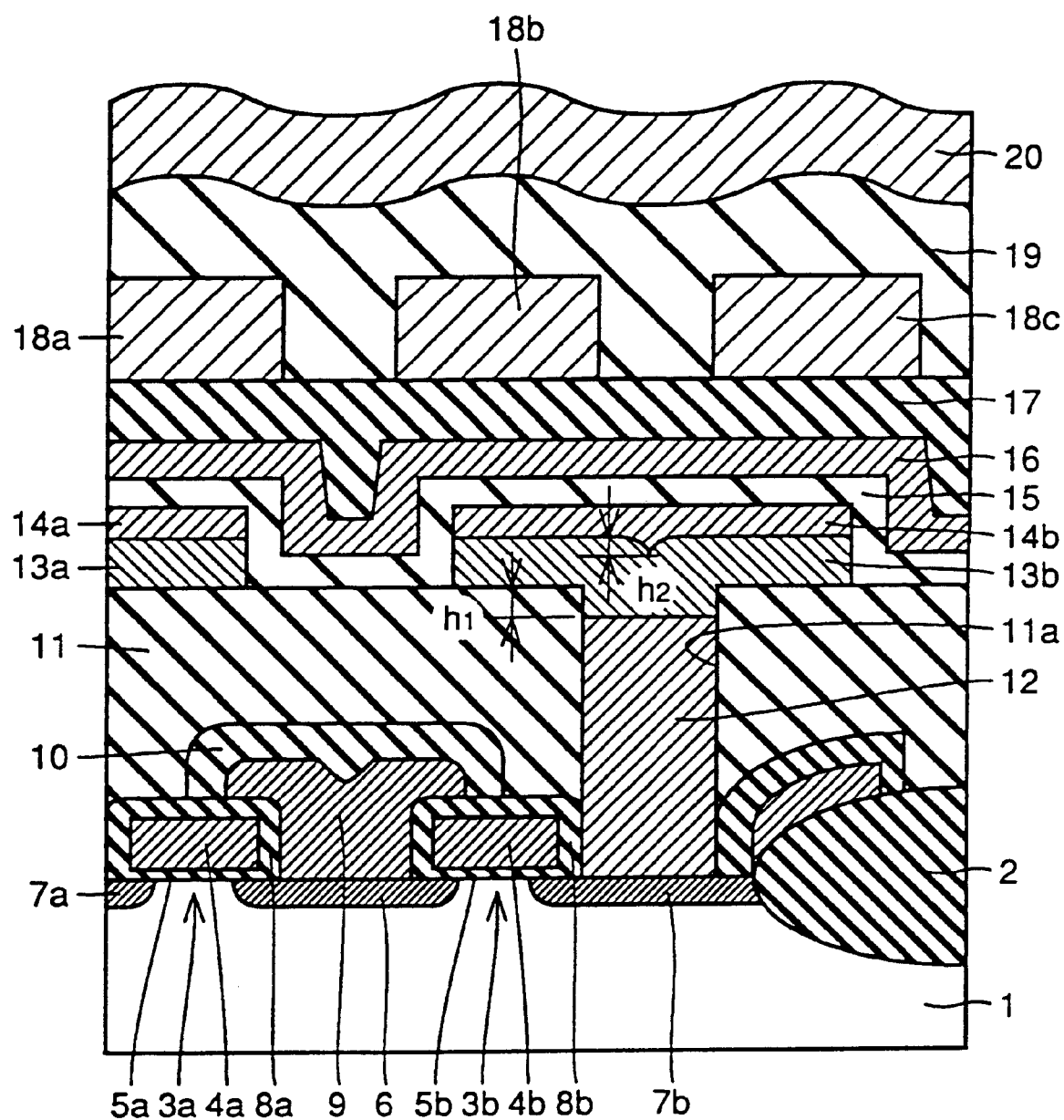
FIG. 1 is a cross sectional structure of a semiconductor memory device according to the first embodiment of the present invention.

Referring to FIG. 1, the first embodiment of a semiconductor memory device according to the present invention will be described.

The cross sectional structure in FIG. 1 shows a memory cell according to the first embodiment of the invention.

A source region 6 and drain regions 7a, 7b formed of an impurity diffusion region are provided at a major surface of a semiconductor substrate 1. A gate electrode 4a is formed on the major surface of semiconductor substrate 1 with a gate oxide film 5a interposed, and a gate electrode 4b is further formed with a gate oxide film 5b interposed. A field oxide film 2 for defining an active region is provided in a prescribed region of the major surface of semiconductor substrate 1.

A buried bit line 9 is provided in source region 6 with gate protection oxide films 8a, 8b interposed for gate electrodes 4a and 4b, and buried bit line 9 is covered with an oxide film 10.

An MOS transistor 3a is constituted by gate electrode 4a, source region 6 and drain region 7a, and an MOS transistor 3b is constituted by gate electrode 4b, source region 6 and drain 7b.

A polysilicon plug 12 is formed in a contact hole 11a provided in an interlayer insulating film 11, and electrically connected to drain region 7b.

According to this embodiment, a barrier metal layer 13b is formed so as to cover both of interlayer insulating film 11 and polysilicon plug 12. Barrier metal layer 13b is formed of thermally formed nitride of refractory metal such as Ti, W, or Ta. This will be hereinafter explained in detail in the discussion of the steps of manufacturing it.

A capacitor lower electrode 14b of platinum is formed on barrier metal layer 13b. A capacitor dielectric film 15 is formed to cover interlayer insulating film 11, capacitor lower electrodes 14a, 14b and barrier metal layers 13a, 13b.

Capacitor dielectric film 15 is formed of material having high dielectric constant such as barium strontium titanate as the conventional art. A capacitor upper electrode 16 is formed to cover capacitor dielectric film 15. Material such as platinum is used for capacitor upper electrode 16. An upper interlayer insulating film 17 formed of an oxide film or the like is provided on capacitor upper electrode 16.

On this upper interlayer insulating film 17, first aluminum interconnection layers 18a, 18b, and 18c are formed with a prescribed spacing therebetween. An aluminum interconnection interlayer insulating film 19 formed of, e.g., an oxide film is provided on the first aluminum interconnection layers 18a, 18b, and 18c. A second aluminum interconnection layer 20 is formed on aluminum interconnection interlayer insulating film 19.

Referring to FIGS. 2–9, a method of manufacturing a semiconductor memory device having above described structure will be explained. It is noted that FIGS. 2–9 show the steps of manufacturing according to the cross sectional structure of FIG. 1.

Figure 2:
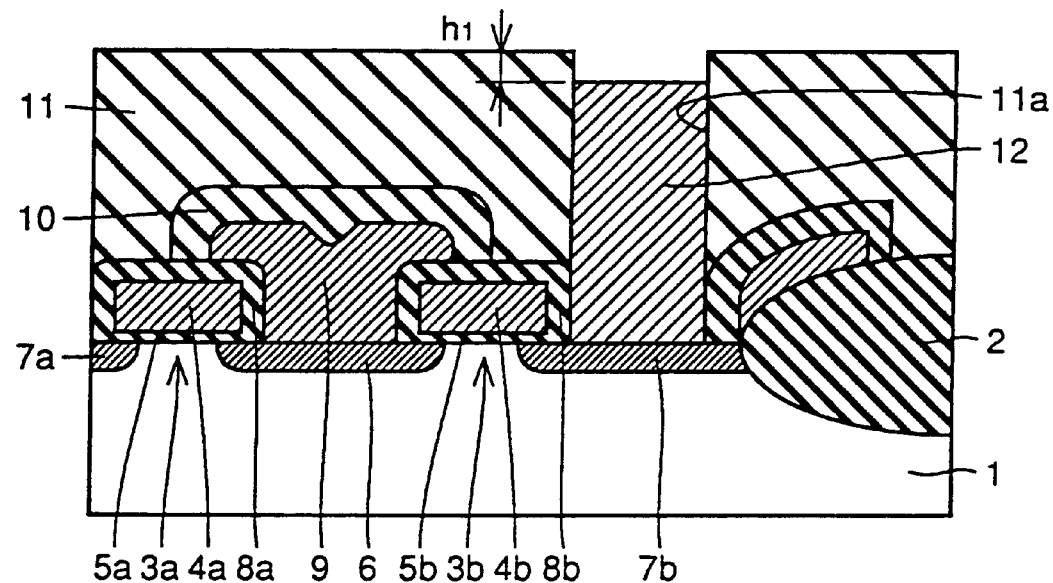
FIGS. 2–9 are cross sections respectively showing the first to the eighth steps of the method of manufacturing a semiconductor memory device according to the first embodiment of the invention.
Figure 3:
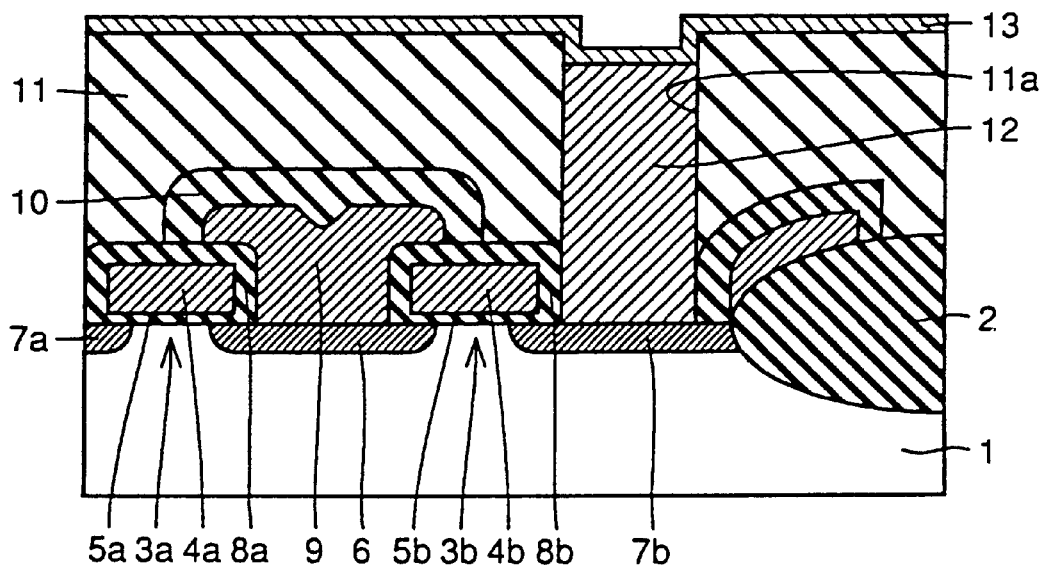

First with reference to FIG. 2, according to the well known technique, field oxide film 2, source region 6, drain regions 7a, 7b, gate oxide films 5a, 5b, gate electrodes 4a, 4b, gate protection oxide films 8a, 8b, buried bit line 9, oxide film 10, interlayer insulating film 11, and contact hole 11a are formed on semiconductor substrate 1.

Polysilicon is next deposited on the portion provided with contact hole 11a in interlayer insulating film 11 by CVD method or the like, then polysilicon plug 12 is formed in contact hole 11a by etching.

A step $h_1$ to the upper end of contact hole 11a is produced on the upper end of polysilicon plug 12 as the one produced according to the conventional technique.

Barrier metal layer 13 of refractory metal material such as Ti, W, or Ta is formed with a film thickness of about 200 Å–1500 Å to cover surfaces of polysilicon plug 12 and interlayer insulating film 11 by sputtering, CVD or the like.

Although the film thickness of barrier metal layer 13 depends on the inner diameter of polysilicon plug 12 and the dimension of $h_1$, approximately one-third to three times of $h_1$ is desirable.

Figure 4:
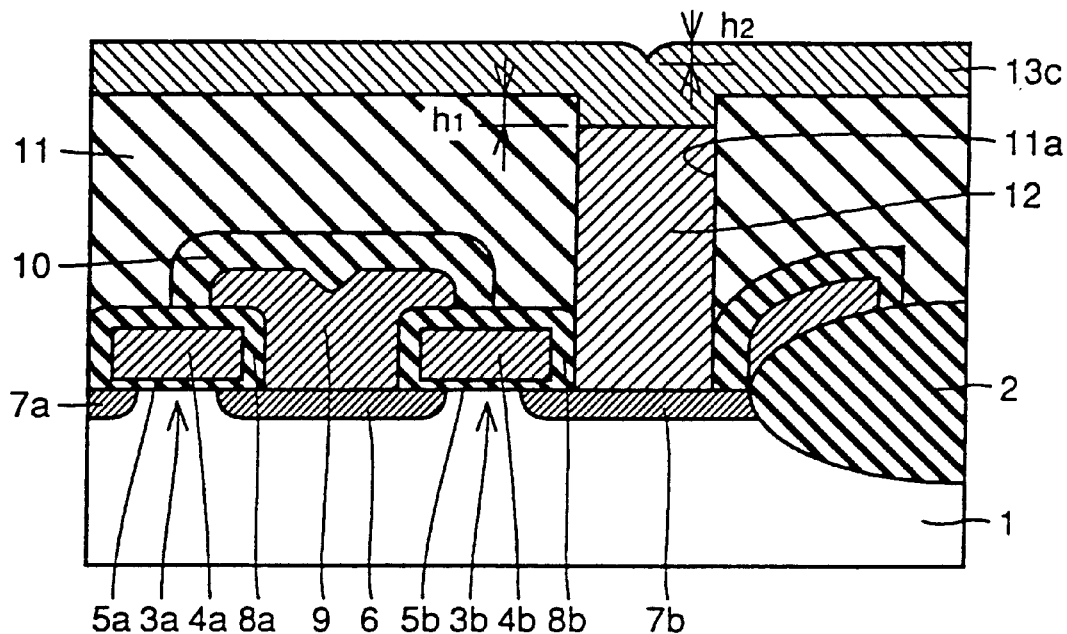

Referring to FIG. 4 next, barrier metal layer 13 is annealed at 700–900° C. for 15 seconds to 2 minutes in the gas ambient including nitrogen atoms such as ammonium, hydrazine, or nitrogen, and barrier metal layer 13 is expanded 2–5 times in volume, producing a nitride film 13c.

It is therefore possible to make the step $h_2$ in barrier metal layer 13c formed on contact hole 11a smaller than the step $h_1$ formed on the upper end of contact hole 11a by having barrier metal layer 13 expanded through annealing.

The concentration of nitrogen is higher in the upper layer portion of barrier metal layer 13c, and the lower layer of barrier metal layer 13c shows extremely low concentration of nitrogen atoms, since nitrogen atoms are introduced into barrier metal layer 13 from the top surface side thereof. For example, the concentration of nitrogen atoms is approximately from $1\times10^{22}$ /cm$^3$ to $1\times10^{23}$ /cm$^3$ in the upper layer portion, and 0 to $1\times10^{21}$ /cm$^3$ in the lower layer portion. The dimension of the step $h_1$ is about 500 Å–800 Å, and that of the step $h_2$ is about 100 Å–200 Å.

Figure 5:
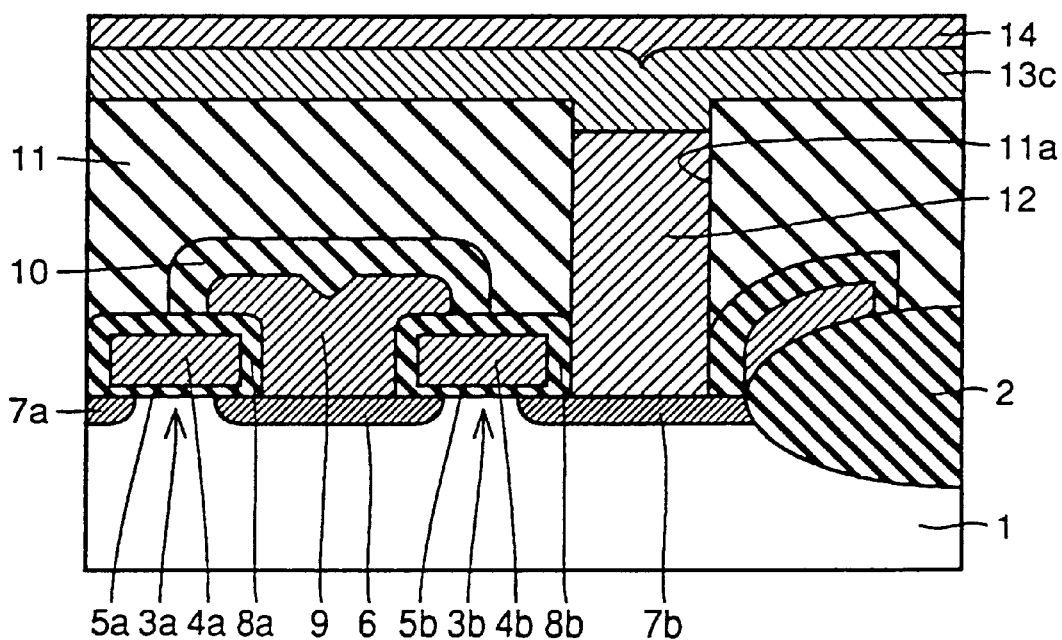

Referring to FIG. 5, lower electrode 14 is formed by depositing platinum 2000 Å–5000 Å in thickness on barrier metal layer 13c by CVD or the sputtering method.

Figure 6:
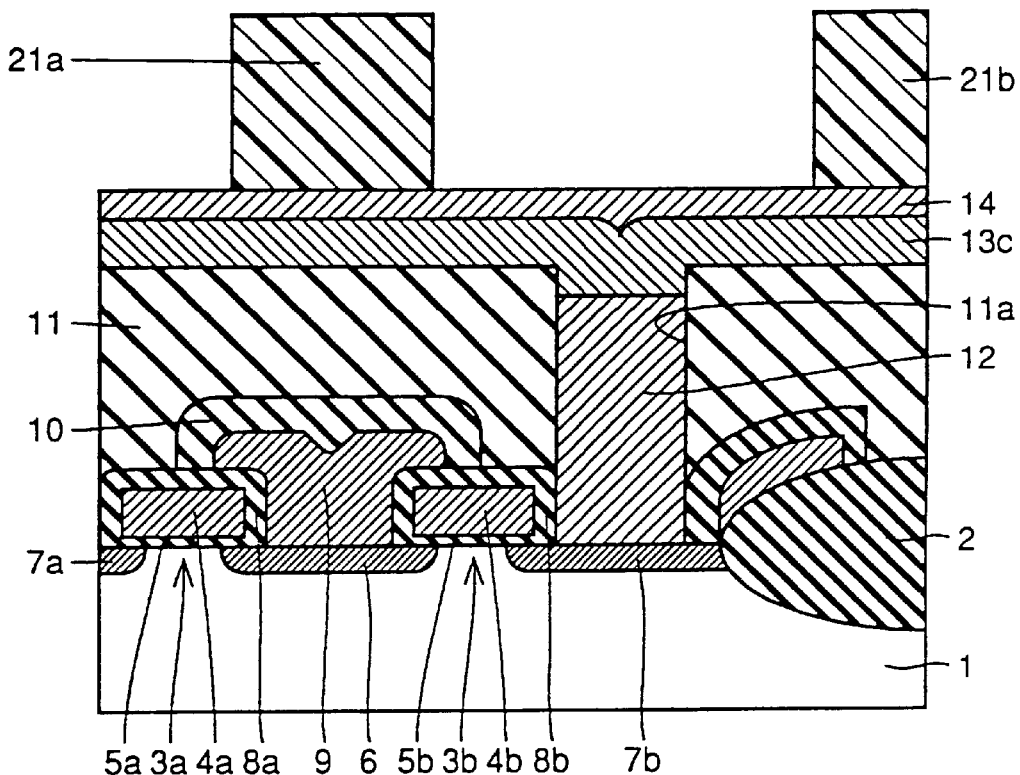

Referring to FIG. 6, resist patterns 21a, 21b of prescribed shape are provided on lower electrode 14 using the photolithography technique.

Figure 7:
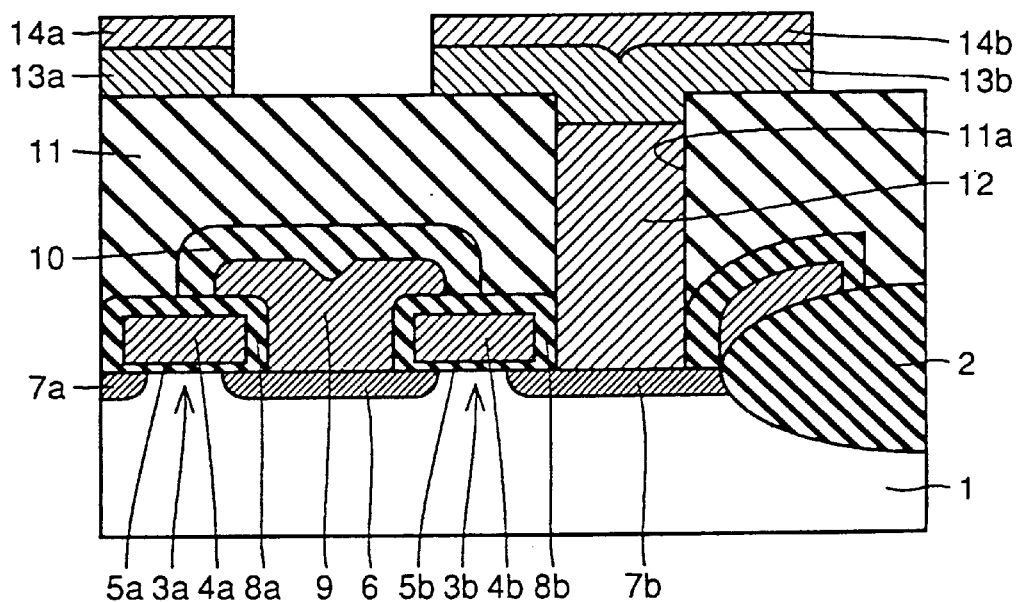

Referring to FIG. 7, lower electrode 14 and barrier metal layer 13c are patterned using resist patterns 21a and 21b as masks to complete barrier metal layers 13a, 13b and lower electrodes 14a, 14b. As the condition of etching, hydrogen bromide (HBr) plus methane gas or the like is utilized.

Figure 8:
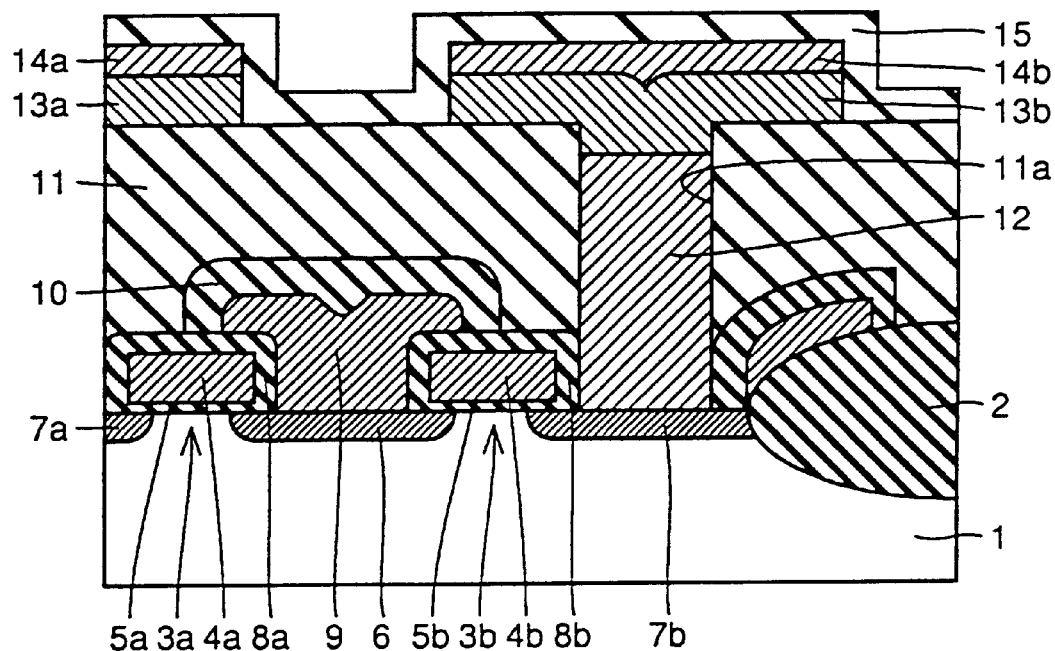

Next with reference to FIG. 8, capacitor dielectric film 15 of material having high dielectric constant such as SrTiO$_3$ or BaTiO$_3$ is formed to the thickness of 500 Å–2000 Å to cover lower electrodes 14a, 14b, barrier metal layers 13a, 13b and interlayer insulating film 11 by using the sputtering method at 500° C.–700° C.

At this time, there is no step portion on the surface of lower electrode 14b because the step portion on contact hole 11a is reduced as shown in FIG. 4. As a result, films can be formed with enhanced step coverage without any step portion in capacitor dielectric film 15.

It is noted that the method of forming a film which would result in lower step coverage could be employed as a method of forming capacitor dielectric film 15, since the step in barrier metal layer 13b is small.

Figure 9:
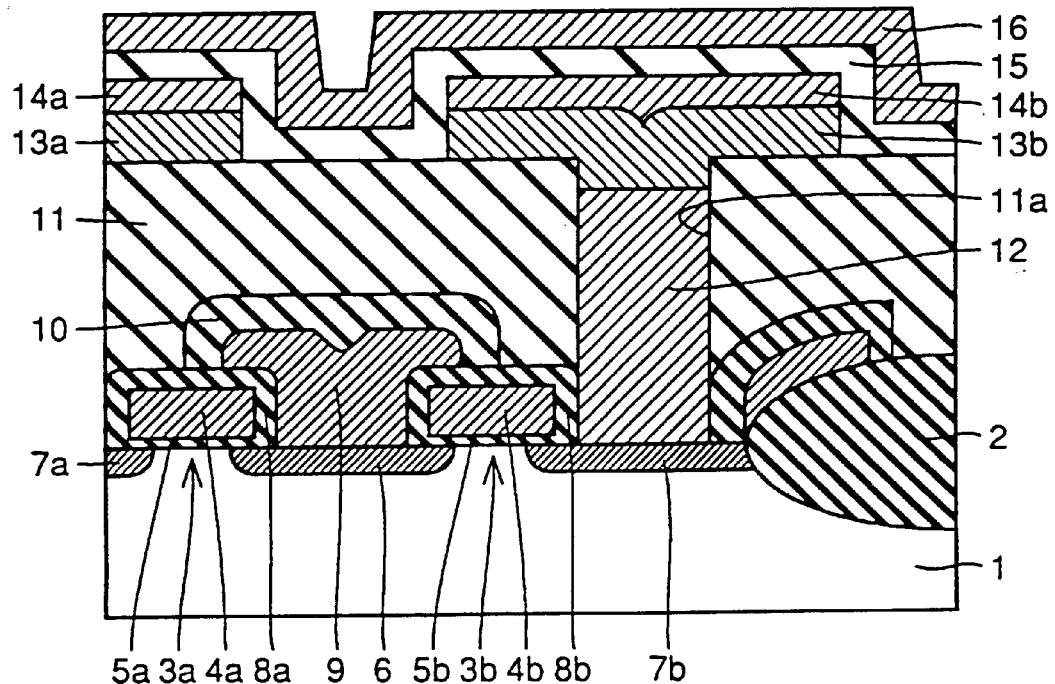

Next with reference to FIG. 9, upper electrode 16 formed, e.g., of platinum is provided on capacitor dielectric film 15. Upper interlayer insulating film 17, first aluminum interconnection layers 18a, 18b and 18c, aluminum interconnection interlayer insulating film 19 and second aluminum interconnection layer 20 are formed according to the method similar to the conventional one, completing the semiconductor memory device shown in FIG. 1.

In the semiconductor memory device and the method of manufacturing the same according to the first embodiment described above, the step portion such as the one found in the conventional structure is not formed in the lower electrode 14b since the step $h_2$ formed on the surface of barrier metal layer 13b is smaller than the step $h_1$ formed on the upper end of contact hole 11a. The life time of dielectric film 15 can be made longer compared with the conventional one because electric field is not concentrated in lower electrode 14b even if voltage is applied to the lower electrode 14b.

The nitrogen concentration gradient is such that it becomes higher from the lower layer of lower electrode 13b in contact with silicon plug 12 to the upper layer in contact with lower electrode 14b. Such a concentration gradient of nitrogen provides a sufficient barrier property as an essential function of a barrier metal layer at the interface between barrier metal layer 13b and lower electrode 14b because barrier metal layer 13b is sufficiently nitrogenized in that region. The concentration gradient of nitrogen can also provide reduced contact resistance to the polysilicon plug at the interface between barrier metal layer 13b and polysilicon plug 12 since barrier metal layer 13b is not nitrogenized in that area.

[Second Embodiment]

Figure 10:
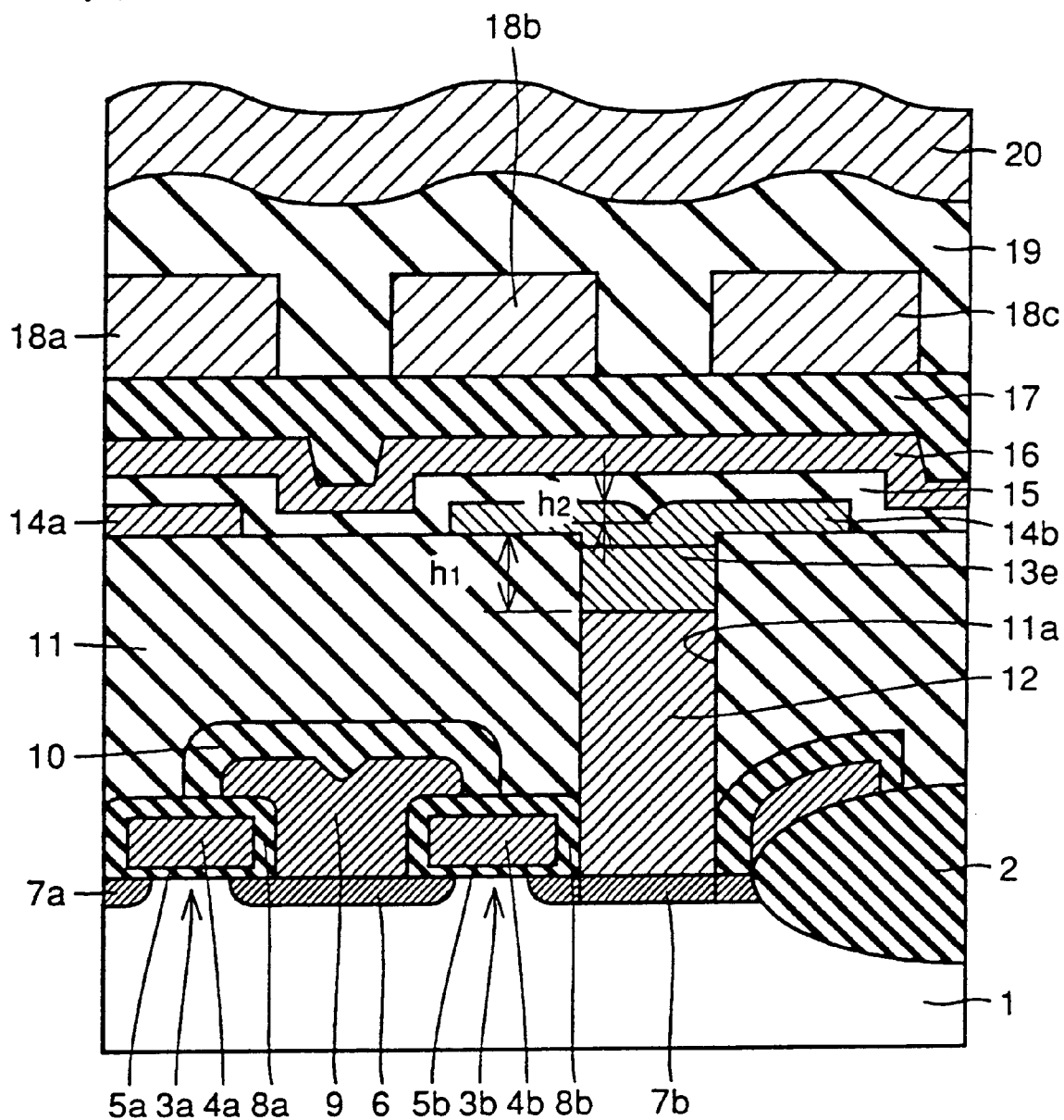
FIG. 10 is a cross sectional structure of a semiconductor memory device according to the second embodiment of the present invention.

Referring to FIG. 10, the second embodiment of a semiconductor memory device according to the present invention will be described.

FIG. 10 illustrates a cross sectional structure of a part of a memory cell in a DRAM, similar to FIG. 1 showing the first embodiment.

In FIG. 10, semiconductor substrate 1, field oxide film 2, source region 6, drain regions 7a, 7b, gate electrodes 4a, 4b, buried bit line 9, oxide film 10, interlayer insulating film 11, and polysilicon plug 12 have the same structures as those shown in FIG. 1.

In the semiconductor memory device according to the second embodiment, a barrier metal layer 13e is formed within contact hole 11a to cover only the upper surface of polysilicon plug 12. Material of refractory metal such as Ti, W, Ta, or Mo or its silicide nitride is used as the material for barrier metal layer 13e. The method of forming barrier metal layer 13e will be described in detail.

Capacitor lower electrode 14b formed, e.g., of platinum is provided on barrier metal layer 13e to cover the surfaces of barrier metal layer 13e and interlayer insulating film 11.

Capacitor dielectric film 15 is formed on lower electrode 14b to cover the surface of interlayer insulating film 11 and capacitor lower electrode 14b.

Material having high dielectric constant such as $SrTiO_3$ or $BaTiO_3$ can be used for capacitor dielectric film 15 as in the first embodiment.

On capacitor dielectric film 15, capacitor upper electrode 16 formed, e.g., of platinum, upper interlayer insulating film 17, first aluminum interconnection layers 18a, 18b and 18c, aluminum interconnection interlayer insulating film 19, and second aluminum interconnection layer 20 are provided as in the first embodiment.

Next, with reference to FIGS. 11–18, a method of manufacturing a semiconductor memory device having above described structure will be explained. FIGS. 11–18 show the steps of manufacturing the device based on the cross section shown in FIG. 10.

Figure 11:
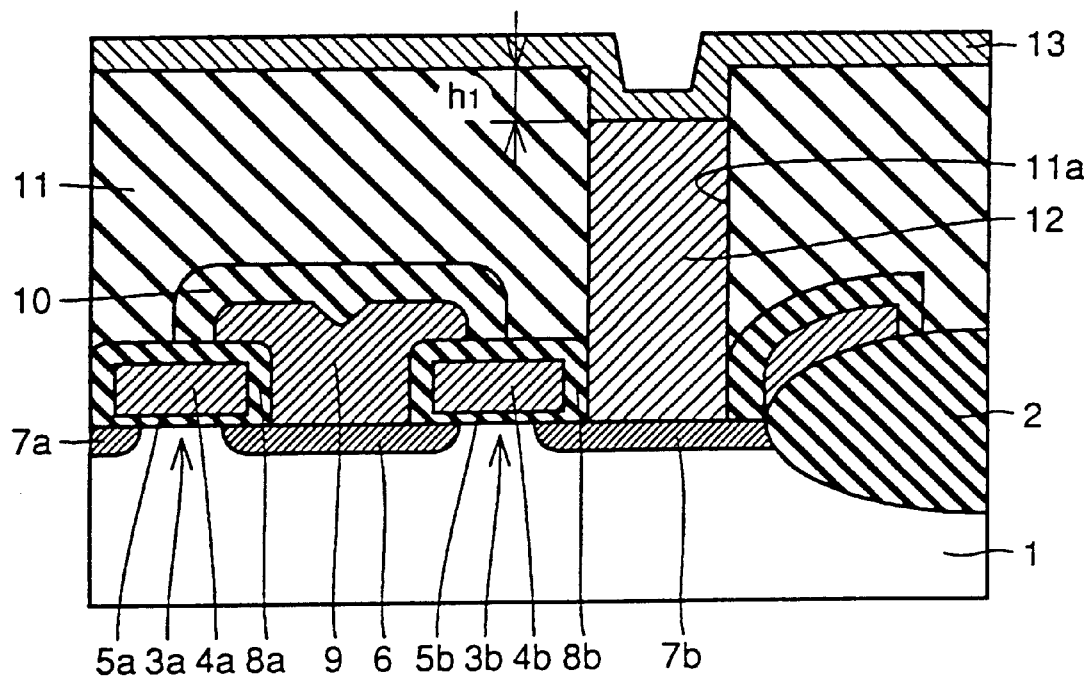
FIGS. 11–18 are cross sections respectively showing the first to the eighth steps of the method of manufacturing a semiconductor memory device according to the second embodiment of the invention.

Referring to FIG. 11 first, gate electrodes 4a, 4b and the like are provided according to the well-known technique as used in the first embodiment with reference to FIG. 2, and polysilicon plug 12 is formed within contact hole 11a. At this time, the step $h_1$ is formed in the upper end portion of contact hole 11a.

Figure 12:
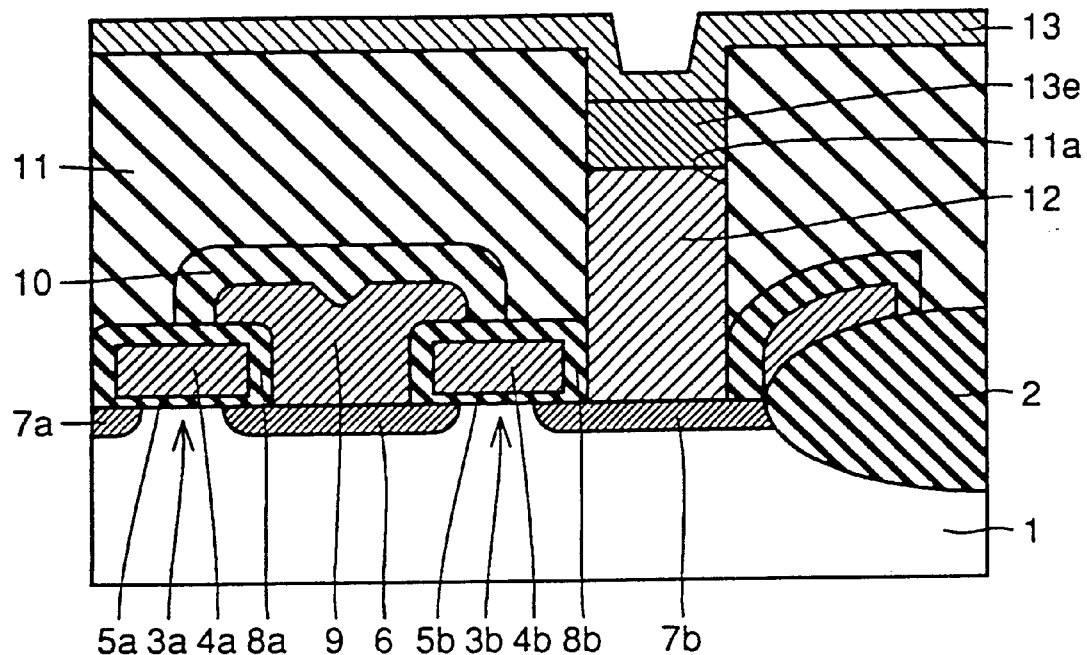

Refractory metal layer 13 such as Ti, W, or Ta is formed 2000 Å–1500 Å in thickness using CVD or the sputtering method to cover the surfaces of polysilicon plug 12 and interlayer insulating film 11. Referring to FIG. 12, refractory metal silicide layer 13e is formed at the interface between polysilicon plug 12 and refractory metal layer 13 by annealing.

Figure 13:
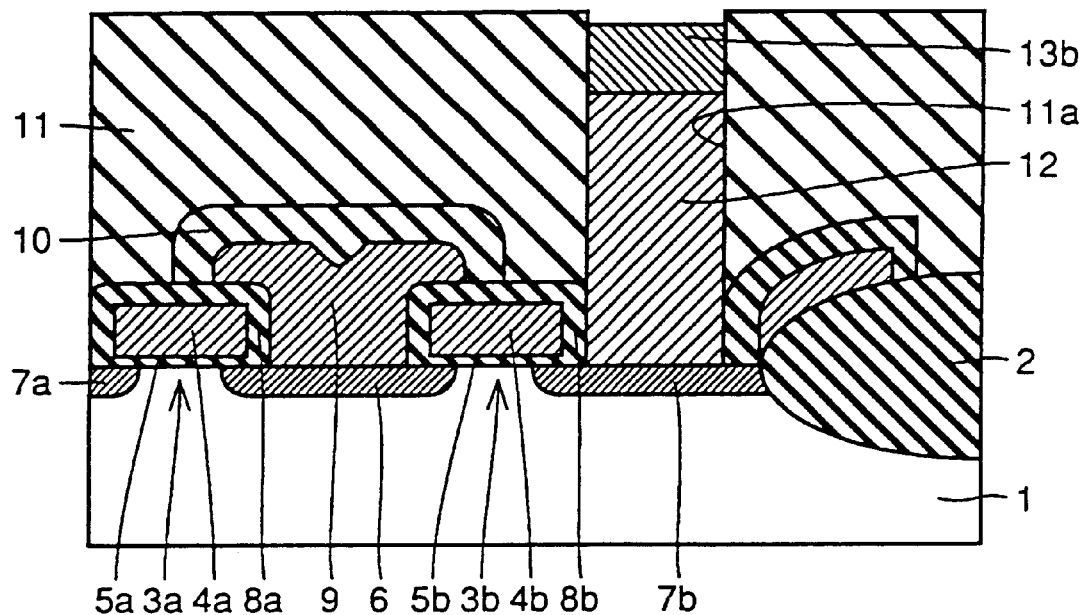

Referring to FIG. 13, unreacted refractory metal silicide layer 13 is removed using solution of sulfuric acid. Refractory metal silicide layer 13e is left on polysilicon plug 12 within contact hole 11a.

Titanium silicide layer 13e is then annealed at the temperature of 700–900° C. for 15 seconds in a gas ambient including nitrogen atoms such as ammonium, hydrogen or nitrogen to be expanded in volume, producing nitrogen film 13b of refractory metal silicide. Adhesion of the refractory metal layer within contact hole 11a can be enhanced by leaving the unreacted refractory metal layer 13.

Figure 14:
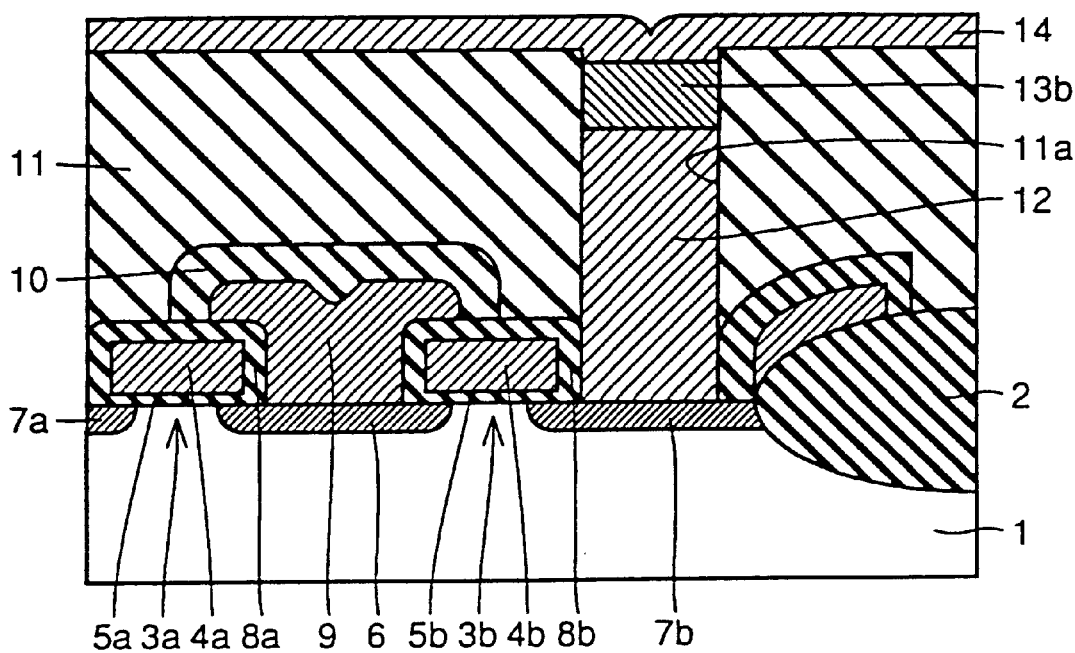

Referring to FIG. 14, capacitor lower electrode 14 formed, e.g., of platinum is deposited to 2000 Å–5000 Å using CVD or the sputtering method as in the first embodiment. In this case, the step portion formed in the upper portion of contact hole 11a is reduced due to the volume expansion of the refractory metal silicide layer, so that the approximately planar film can be provided on the surface portion of capacitor lower electrode 14 without any step portion.

Figure 15:
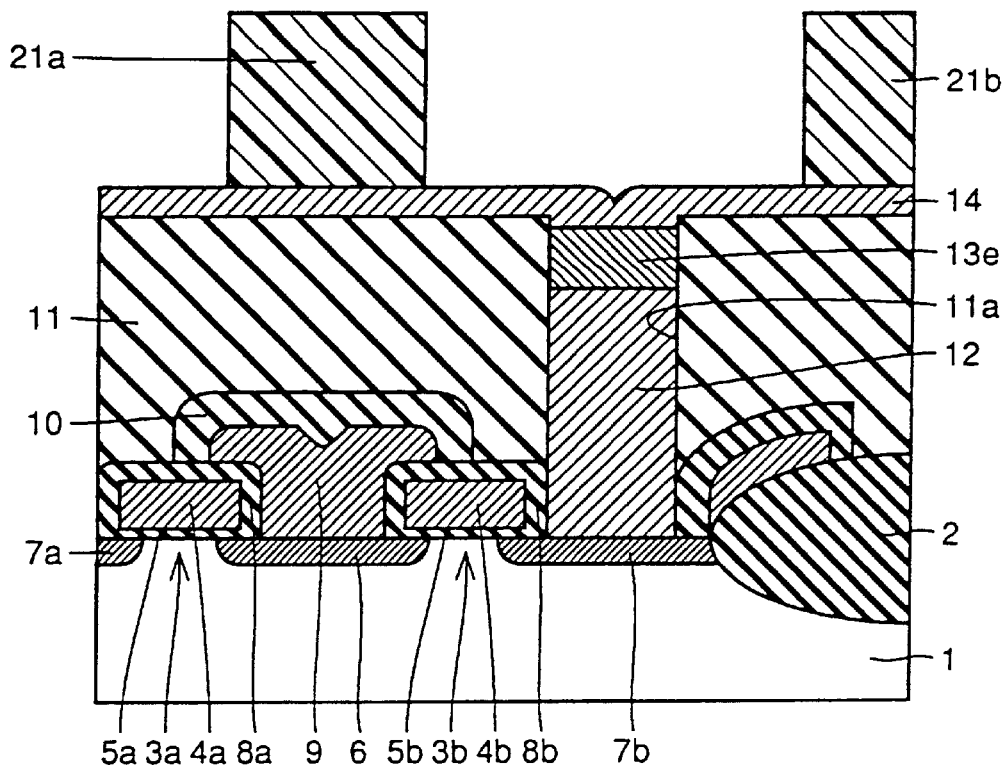

With reference to FIG. 15 next, resist films 21a, 21b provided with patterns of prescribed shapes are formed on capacitor lower electrode 14 using the photolithography technique.

Figure 16:
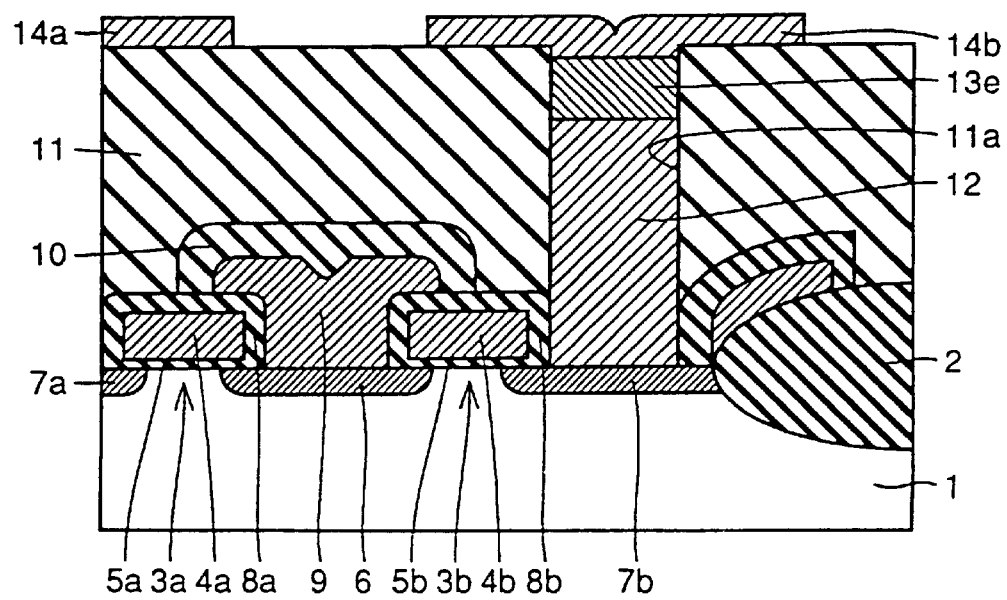

Referring to FIG. 16, capacitor lower electrodes 14a, 14b are completed by etching capacitor lower electrode layer 14 using resist patterns 21a, 21b as masks.

Figure 17:
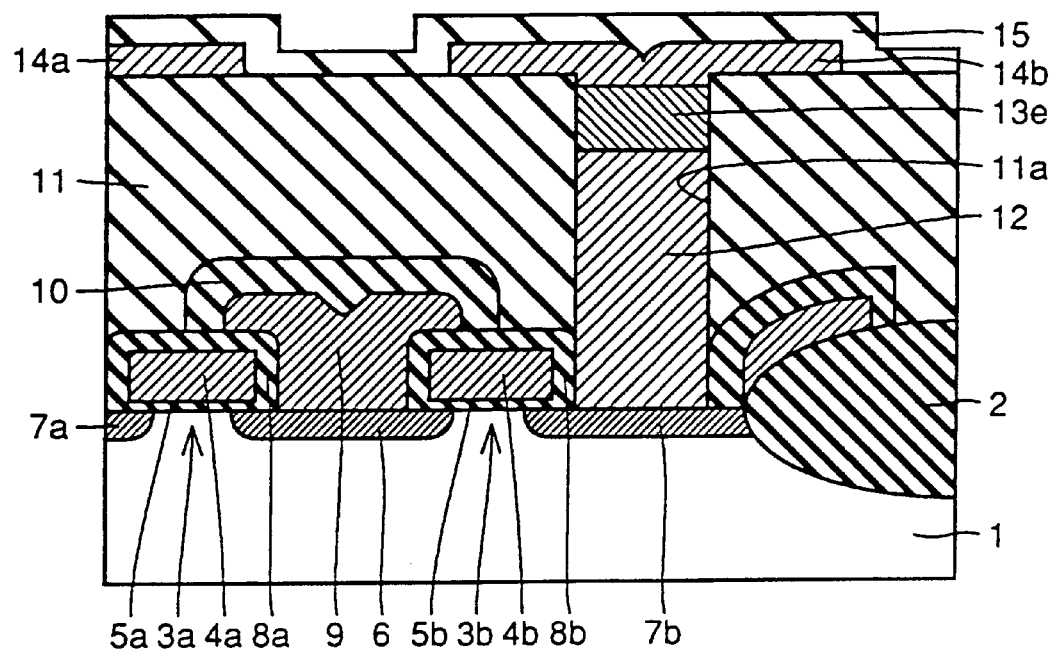

Referring to FIG. 17, capacitor dielectric film 15 formed of material having high dielectric constant such as $SrTiO_3$ or $BaTiO_3$ is formed to a thickness of 500 Å–2000 Å using sputtering method or the like at the temperature of 500° C.–700° C. to cover interlayer insulting film 11 and capacitor lower electrodes 14a, 14b.

At the surface of capacitor lower electrode 14b in the upper portion of contact hole 11a, there is no step portion so that highly planer capacitor dielectric film 15 can be produced. A method of forming the film having low step coverage can be employed as that of forming capacitor dielectric film 15.

Figure 18:
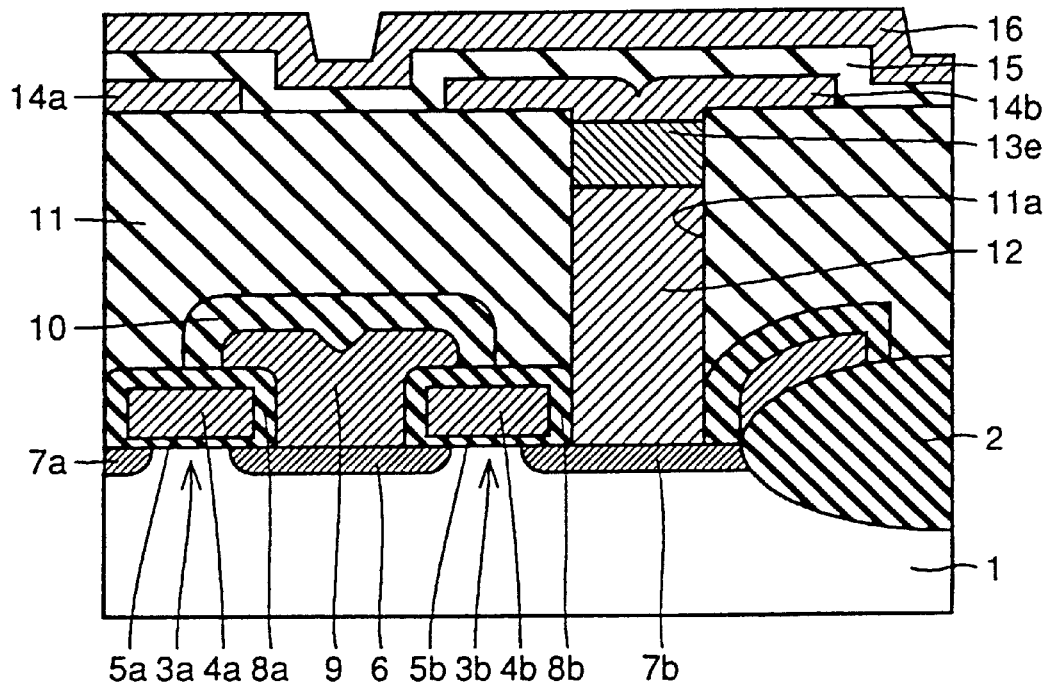
Figure 19:
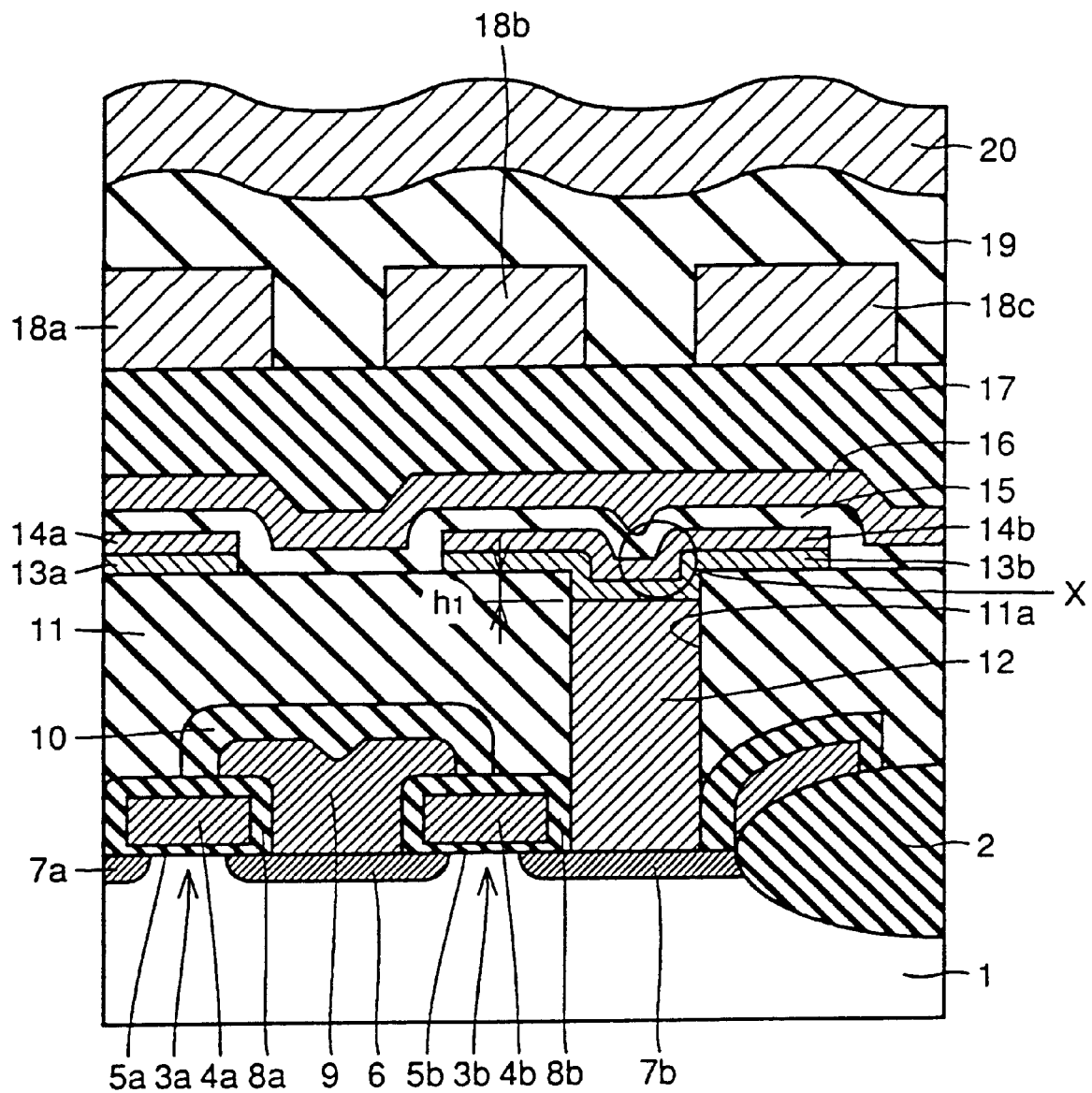
FIG. 19 is a cross sectional structure of a semiconductor memory device according to the conventional art.

Next with reference to FIG. 18, capacitor upper electrode 16 is formed using, e.g., platinum to cover capacitor dielectric film 15. Capacitor upper interlayer insulating film 17, first aluminum interconnections 18a, 18b, 18c, first aluminum interlayer insulating film 19 and second aluminum interconnection layer 20 are formed according to the method similar to that of the conventional art and first embodiment.

In the semiconductor memory device and the method of manufacturing the same according to the second embodiment, barrier metal layer 13e formed of nitride film of refractory metal silicide is provided on the upper layer of polysilicon plug 12 in contact hole 11a as is described above. Longer life time of capacitor dielectric film 15 can be obtained since there is not a step on the surface portion of capacitor lower electrode 14b formed on barrier metal layer 13e, and there is not concentration of electrical field either, even if voltage is applied to lower electrode 14b, resulting in an improved reliability of the capacitor.

Barrier metal layer 13e is sufficiently nitrogenized at the interface portion between itself and lower electrode 14b and the concentration of silicon therein is low, so that sufficient barrier property of barrier metal layer 13b is ensured. Barrier metal layer 13e is not highly nitrogenized at the interface between itself and polysilicon plug 12 and the concentration of silicon is high therein, so that low contact resistance to polysilicon plug 12 and a sufficient contact property can be realized.

In the semiconductor memory device according to one aspect of the present invention, the step found in the conventional structure is not formed in the lower electrode, since the step $h_2$ formed on the surface of the barrier metal layer is smaller than the step hi formed on the upper end of the contact hole. Therefore, electric field is not concentrated in the lower electrode even if voltage is applied to the lower electrode. As a result, the life time of the dielectric film can be extended, preventing the degradation of the dielectric film opposite to the lower electrode. The reliability of the capacitor can thus be improved.

In the semiconductor memory device according to another aspect of the present invention, the contact resistance to the plug electrode at the interface between the barrier metal layer and the plug electrode can be reduced since the barrier metal layer is formed of metal nitride having such a concentration gradient of nitrogen which becomes higher from its lower layer to its upper layer and the concentration of nitrogen is low in the lower layer of the barrier metal layer. On the other hand, the upper layer portion of the barrier metal layer has sufficiently high concentration of nitrogen so that the barrier metal layer has an enough barrier property for the lower electrode at the interface between the barrier metal layer and the capacitor lower electrode. The improvement of the capacitor reliability can be obtained accordingly.

In the semiconductor memory device according to still another aspect of the present invention, since the barrier metal layer is buried within the contact hole so that the step $h_2$ formed on the surface of the capacitor lower electrode is smaller than the step hi formed on the upper end of the contact hole, the step portion found in the conventional structure is not formed in the lower electrode.

As a result, electric field is not concentrated in the lower electrode even if voltage is applied to the lower electrode, so that degradation of the dielectric film formed on the lower electrode can be prevented and the life time of the dielectric film can be extended. The capacitor reliability can thus be improved.

In the semiconductor memory device according to a further aspect of the present invention, contact resistance to the plug electrode at the interface between the barrier metal layer and the plug electrode can be reduced, since the barrier metal layer is formed of metal nitride having such a concentration gradient of nitrogen which becomes higher from the lower layer to the upper layer to generate low concentration of nitrogen in the lower layer of the barrier metal layer. On the other hand, the barrier property can be ensured at the interface between the barrier metal layer and the lower electrode, since the upper layer of the barrier metal layer is sufficiently nitrogenized. The reliability of the capacitor can be enhanced accordingly.

In one aspect of the method of manufacturing a semiconductor memory device according to the invention, the metal layer on the plug electrode formed within the contact hole is expanded in volume by annealing the metal layer in a gas ambient including nitrogen atoms in the step of forming the barrier metal layer. The step at the upper portion of the contact hole can be thus reduced by having the metal layer expanded in the upper portion of the contact hole.

As a result, the step portion found in the conventional structure is not formed on the surface of the capacitor lower electrode formed on the barrier metal layer. Degradation of the dielectric film on the lower electrode can be prevented and the life time of the dielectric film can be extended since there is no concentration of the electric field in the lower electrode even if voltage is applied to the lower electrode. The reliability of the capacitor can thus be enhanced.

Contact resistance to the plug electrode can be reduced at the interface between the barrier metal layer and the plug electrode by providing the barrier metal layer formed of metal nitride having such a concentration gradient of nitrogen which becomes higher from its lower layer to its upper layer to generate low concentration of nitrogen in the lower layer of the barrier metal layer. On the other hand, the upper layer portion of the barrier metal layer is nitrogenized sufficiently to provide the enough barrier property at the interface between the barrier metal layer and the lower electrode. The reliability of the capacitor can thus be improved.

In another aspect of the semiconductor memory device according to the present invention, the metal silicide layer is formed between the plug electrode and the metal layer by the first annealing, and the barrier metal layer is formed by the second annealing of the metal silicide layer in the gas ambient including nitrogen atoms. The metal silicide layer is accordingly expanded in volume through the second annealing of the metal silicide layer in the gas ambient including nitrogen atoms.

Accordingly, the step formed in the upper portion of the contact hole can be reduced, and the step portion found in the conventional structure is not produced in the capacitor lower electrode formed on the barrier metal layer. The longer life time of the dielectric film formed on the lower electrode can be provided since there is no concentration of electric field in the lower electrode even if voltage is applied to the lower electrode. The reliability of the capacitor can thus be enhanced.

Contact resistance to the plug electrode at the interface between the barrier metal layer and the plug electrode can be reduced since the barrier metal layer is formed of metal nitride having such a concentration gradient of nitrogen which becomes higher from the lower layer to the upper layer and therefore the concentration of nitrogen is low in the lower layer of the barrier metal layer. On the other hand, the sufficient barrier property can be maintained at the interface between the barrier metal layer and the lower electrode since the upper layer of the barrier metal layer is sufficiently nitrogenized. As a result, the capacitor reliability can be improved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor memory device, comprising:

forming an impurity region at a major surface of a semiconductor substrate;

forming a plug electrode electrically connected to said impurity region in said contact hole down to a distance $h_1$ below an upper end of said contact hole;

forming a metal layer on surfaces of said plug electrode and said interlayer insulating film;

forming a barrier metal layer by annealing said metal layer in gas ambient including nitrogen atoms, said barrier metal layer having a step portion $h_2$ less than $h_1$, on a surface opposite said contact hole, and said barrier metal layer having a film thickness of one-third to three times $h_1$, said barrier metal layer formed of a material having a volume greater than that of the metal layer by expanding the volume of the metal layer during annealing;

forming a capacitor lower electrode layer on the surface of said barrier metal layer;

patterning said barrier metal layer and said capacitor lower electrode layer to a shape;

forming a capacitor dielectric film of material having high dielectric constant to cover said capacitor lower electrode layer and said barrier metal layer; and forming a capacitor upper electrode to cover said capacitor dielectric film.

2. The method of manufacturing a semiconductor memory device according to claim 1, wherein said gas ambient including nitrogen atoms is at least one selected from the group consisting of nitrogen, hydrazide and ammonia.

3. The method of manufacturing a semiconductor memory device according to claim 1, wherein said annealing is conducted for 15 seconds to 2 minutes at a temperature of 700 to 900° C.

4. A method of manufacturing a semiconductor memory device comprising:

forming an impurity region at a major surface of a semiconductor substrate;

forming an interlayer insulating film having a contact hole connected to said impurity region on said major surface of said semiconductor substrate;

forming a plug electrode electrically connected to said impurity region including silicon in said contact hole down to a distance $h_1$ below an upper end of said contact hole;

forming a metal layer on surfaces of said plug electrode and said interlayer insulating film;

forming a metal silicide layer between said plug electrode and said metal layer by a first annealing;

annealing said metal suicide layer in a gas ambient including nitrogen atoms to form a nitride barrier metal layer having a film thickness of one-third to three times $h_1$;

leaving said nitride barrier metal layer in the contact hole;

forming a capacitor lower electrode on a surface of said nitride barrier metal layer and said insulating film;

forming a capacitor dielectric film of material having a high dielectric constant to cover said capacitor lower electrode and said interlayer insulating film; and forming a capacitor upper electrode to cover said capacitor dielectric film.

5. The method of manufacturing a semiconductor memory device according to claim 4, wherein said gas ambient including nitrogen atoms is at least one selected from the group consisting of nitrogen, hydrazide and ammonia.

6. The method of manufacturing a semiconductor memory device according to claim 4, wherein said first annealing is conducted for 15 seconds to 2 minutes at a temperature of 700 to 900° C.

* * * * *